(12) United States Patent
DeLaCruz et al.

(10) Patent No.: US 11,599,299 B2
(45) Date of Patent: Mar. 7, 2023

(54) 3D MEMORY CIRCUIT

(71) Applicant: Invensas LLC, San Jose, CA (US)

(72) Inventors: Javier A. DeLaCruz, San Jose, CA (US); David E. Fisch, Corrales, NM (US)

(73) Assignee: Invensas LLC, San Jose, CA (US)

( * ) Notice: Subject to any disclaimer, the term of this patent is extended or adjusted under 35 U.S.C. 154(b) by 91 days.

(21) Appl. No.: 17/098,299

(22) Filed: Nov. 13, 2020

(65) Prior Publication Data

US 2021/0149586 A1 May 20, 2021

Related U.S. Application Data

(60) Provisional application No. 62/937,749, filed on Nov. 19, 2019.

(51) Int. Cl.
*G11C 13/00* (2006.01)
*G06F 3/06* (2006.01)
(Continued)

(52) U.S. Cl.
CPC ............ *G06F 3/0655* (2013.01); *G06F 3/061* (2013.01); *G06F 3/064* (2013.01); *G06F 3/0679* (2013.01);
(Continued)

(58) Field of Classification Search
CPC ........ G06F 3/0655; G06F 3/061; G06F 3/064; G06F 3/0679; G11C 5/025; G11C 8/08;
(Continued)

(56) References Cited

U.S. PATENT DOCUMENTS 5,016,138 A 5/1991 Woodman
5,376,825 A 12/1994 Tukamoto et al.
(Continued)

FOREIGN PATENT DOCUMENTS

EP 3698401 A1 8/2020
EP 3698402 A1 8/2020
(Continued)

OTHER PUBLICATIONS

Author Unknown, "Fact Sheet: New Intel Architectures and Technologies Target Expanded Market Opportunities," Dec. 12, 2018, 9 pages, Intel Corporation, Santa Clara, California.
(Continued)

*Primary Examiner* — Michael T Tran
(74) *Attorney, Agent, or Firm* — Haley Guiliano LLP

(57) ABSTRACT

Some embodiments provide a three-dimensional (3D) circuit that has data lines of one or more memory circuits on a different IC die than the IC die(s) on which the memory blocks of the memory circuit(s) are defined. In some embodiments, the 3D circuit includes a first IC die with a first set of two or more memory blocks that have a first set of data lines. The 3D circuit also includes a second IC die that is stacked with the first IC dies and that includes a second set of two or more memory blocks with a second set of data lines. The 3D circuit further includes a third IC die that is stacked with the first and second IC dies and that includes a third set of data lines, which connect through several z-axis connections with the first and second sets of data lines to carry data to and from the first and second memory block sets when data is being written to and read from the first and second memory block sets. The z-axis connections in some embodiments electrically connect circuit nodes in overlapping portions of the first and third IC dies, and overlapping portions of second and third IC dies,
(Continued)

in order to carry data between the third set of data lines on the third IC die and the first and second set of data lines of the first and second of memory block sets on the first and second IC dies. These z-axis connections between the dies are very short as the dies are very thin. For instance, in some embodiments, the z-axis connections are less than 10 or 20 microns. The z-axis connections are through silicon vias (TSVs) in some embodiments.

14 Claims, 7 Drawing Sheets

(51) Int. Cl.
  *G11C 8/08* (2006.01)
  *G11C 8/14* (2006.01)
  *G11C 5/02* (2006.01)
  *H01L 25/065* (2023.01)
  *G11C 11/408* (2006.01)
  *G11C 16/08* (2006.01)
  *G11C 7/10* (2006.01)

(52) U.S. Cl.
  CPC ............ *G11C 5/025* (2013.01); *G11C 8/08* (2013.01); *G11C 8/14* (2013.01); *G11C 11/408* (2013.01); *H01L 25/0657* (2013.01); *G11C 7/1006* (2013.01); *G11C 13/0023* (2013.01); *G11C 16/08* (2013.01); *G11C 2213/71* (2013.01)

(58) Field of Classification Search
  CPC ....... G11C 8/14; G11C 11/408; G11C 7/1006; G11C 13/0023; G11C 16/08; G11C 2213/71; G11C 8/12; G11C 11/4093; G11C 11/4096; G11C 11/4097; H01L 25/0657; H01L 24/16; H01L 25/16; H01L 25/18; H01L 2224/16145; H01L 2224/16225; H01L 2924/00014; H01L 2924/1434; H01L 2924/15311; H01L 2924/16195; H01L 2924/171
  USPC .......................................... 365/185.17, 185.24
  See application file for complete search history.

(56) References Cited

U.S. PATENT DOCUMENTS

| | | | |
|---|---|---|---|
| 5,579,207 A | 11/1996 | Hayden et al. | |
| 5,621,863 A | 4/1997 | Boulet et al. | |
| 5,673,478 A | 10/1997 | Beene et al. | |
| 5,717,832 A | 2/1998 | Steimle et al. | |
| 5,740,326 A | 4/1998 | Boulet et al. | |
| 5,793,115 A | 8/1998 | Zavracky et al. | |
| 5,909,587 A | 6/1999 | Tran | |
| 6,320,255 B1 | 11/2001 | Terrill et al. | |
| 6,421,654 B1 | 7/2002 | Gordon | |
| 6,707,124 B2 | 3/2004 | Wachtler et al. | |
| 6,844,624 B1 | 1/2005 | Kiritani | |
| 6,891,447 B2 | 5/2005 | Song | |
| 6,909,194 B2 | 6/2005 | Farnworth et al. | |
| 6,917,219 B2 | 7/2005 | New | |
| 6,962,835 B2 | 11/2005 | Tong et al. | |
| 7,046,522 B2 | 5/2006 | Sung et al. | |
| 7,099,215 B1 | 8/2006 | Rotenberg et al. | |
| 7,124,250 B2 | 10/2006 | Kyung | |
| 7,202,566 B2 | 4/2007 | Liaw | |
| 7,485,968 B2 | 2/2009 | Enquist et al. | |
| 7,638,869 B2 | 12/2009 | Irsigler et al. | |
| 7,692,946 B2 | 4/2010 | Taufique et al. | |
| 7,863,918 B2 | 1/2011 | Jenkins et al. | |
| 8,032,711 B2 | 10/2011 | Black et al. | |
| 8,042,082 B2 | 10/2011 | Solomon | |
| 8,110,899 B2 | 2/2012 | Reed et al. | |
| 8,148,814 B2 | 4/2012 | Furuta et al. | |
| 8,432,467 B2 | 4/2013 | Jaworski et al. | |
| 8,516,409 B2 | 8/2013 | Coteus et al. | |
| 8,546,955 B1 | 10/2013 | Wu | |
| 8,547,769 B2 | 10/2013 | Saraswat et al. | |
| 8,704,384 B2 | 4/2014 | Wu et al. | |
| 8,736,068 B2 | 5/2014 | Bartley et al. | |
| 8,797,818 B2 | 8/2014 | Jeddeloh | |
| 8,816,506 B2 | 8/2014 | Kawashita et al. | |
| 8,860,199 B2 | 10/2014 | Black et al. | |
| 8,901,749 B2 | 12/2014 | Kim et al. | |
| 8,907,439 B1 | 12/2014 | Kay et al. | |
| 8,930,647 B1 | 1/2015 | Smith | |
| 8,947,931 B1 | 2/2015 | d'Abreu | |
| 9,067,272 B2 | 6/2015 | Sutanto et al. | |
| 9,076,700 B2 | 7/2015 | Kawashita et al. | |
| 9,142,262 B2 | 9/2015 | Ware | |
| 9,300,298 B2 | 3/2016 | Cordero et al. | |
| 9,318,418 B2 | 4/2016 | Kawashita et al. | |
| 9,432,298 B1 | 8/2016 | Smith | |
| 9,478,496 B1 | 10/2016 | Lin | |
| 9,497,854 B2 | 11/2016 | Giuliano | |
| 9,501,603 B2 | 11/2016 | Barowski et al. | |
| 9,508,607 B2 | 11/2016 | Chua-Eoan et al. | |
| 9,640,233 B2 | 5/2017 | Sohn | |
| 9,645,603 B1 | 5/2017 | Chall et al. | |
| 9,647,187 B1 | 5/2017 | Yap et al. | |
| 9,691,739 B2 | 6/2017 | Kawashita et al. | |
| 9,726,691 B2 | 8/2017 | Garibay et al. | |
| 9,746,517 B2 | 8/2017 | Whetsel | |
| 9,853,053 B2 * | 12/2017 | Lupino | G11C 11/161 |
| 9,915,978 B2 | 3/2018 | Dabby et al. | |
| 10,121,743 B2 | 11/2018 | Kamal et al. | |
| 10,255,969 B2 | 4/2019 | Eom et al. | |
| 10,262,911 B1 | 4/2019 | Gong et al. | |
| 10,269,394 B2 * | 4/2019 | Kim | G06F 12/0638 |
| 10,269,586 B2 | 4/2019 | Chou et al. | |
| 10,289,604 B2 | 5/2019 | Sankaralingam et al. | |
| 10,347,354 B2 * | 7/2019 | Zimmerman | G01R 31/3177 |
| 10,373,657 B2 * | 8/2019 | Kondo | G11C 7/1066 |
| 10,446,207 B2 | 10/2019 | Kim et al. | |
| 10,446,601 B2 | 10/2019 | Otake et al. | |
| 10,490,281 B2 * | 11/2019 | Park | G11C 7/1018 |
| 10,580,735 B2 | 3/2020 | Mohammed et al. | |
| 10,580,757 B2 | 3/2020 | Nequist et al. | |
| 10,580,817 B2 | 3/2020 | Otake et al. | |
| 10,586,786 B2 | 3/2020 | Delacruz et al. | |
| 10,593,667 B2 | 3/2020 | Delacruz et al. | |
| 10,600,691 B2 | 3/2020 | Delacruz et al. | |
| 10,600,735 B2 | 3/2020 | Delacruz et al. | |
| 10,600,780 B2 | 3/2020 | Delacruz et al. | |
| 10,607,136 B2 | 3/2020 | Teig et al. | |
| 10,672,663 B2 | 6/2020 | DeLaCruz et al. | |
| 10,672,743 B2 | 6/2020 | Teig et al. | |
| 10,672,744 B2 | 6/2020 | Teig et al. | |
| 10,672,745 B2 | 6/2020 | Teig et al. | |
| 10,719,762 B2 | 7/2020 | Teig et al. | |
| 10,762,420 B2 | 9/2020 | Teig et al. | |
| 2001/0017418 A1 | 8/2001 | Noguchi et al. | |
| 2003/0227795 A1 * | 12/2003 | Seyyedy | G11C 11/1653 365/173 |
| 2005/0127490 A1 | 6/2005 | Black et al. | |
| 2006/0036559 A1 | 2/2006 | Nugent | |
| 2007/0220207 A1 | 9/2007 | Black et al. | |
| 2008/0080261 A1 * | 4/2008 | Shaeffer | G11C 11/4091 365/189.05 |
| 2009/0070727 A1 | 3/2009 | Solomon | |
| 2010/0085825 A1 * | 4/2010 | Keeth | G06F 12/10 365/230.01 |
| 2010/0140750 A1 | 6/2010 | Toms | |
| 2010/0195364 A1 * | 8/2010 | Riho | H01L 27/0296 365/63 |
| 2011/0121433 A1 * | 5/2011 | Kim | H01L 24/06 257/737 |
| 2011/0184688 A1 * | 7/2011 | Uetake | G11C 29/40 702/120 |
| 2011/0208906 A1 * | 8/2011 | Gillingham | G06F 13/4234 711/E12.078 |

(56) References Cited

U.S. PATENT DOCUMENTS

| | | | |
|---|---|---|---|
| 2012/0201068 A1 | 8/2012 | Ware | |
| 2012/0242346 A1 | 9/2012 | Wang et al. | |
| 2012/0243355 A1* | 9/2012 | Shin | G11C 29/4401 |
| | | | 365/230.01 |
| 2012/0250286 A1* | 10/2012 | Chi | H01L 25/0657 |
| | | | 361/820 |
| 2013/0032950 A1 | 2/2013 | Ware et al. | |
| 2013/0051116 A1 | 2/2013 | En et al. | |
| 2013/0144542 A1 | 6/2013 | Ernst et al. | |
| 2013/0187292 A1 | 7/2013 | Semmelmeyer et al. | |
| 2013/0207268 A1 | 8/2013 | Chapelon | |
| 2013/0242500 A1 | 9/2013 | Lin et al. | |
| 2013/0275798 A1* | 10/2013 | Kondo | G06F 1/12 |
| | | | 713/500 |
| 2013/0275823 A1 | 10/2013 | Cordero et al. | |
| 2014/0022002 A1 | 1/2014 | Chua-Eoan et al. | |
| 2014/0040698 A1* | 2/2014 | Loh | G06F 11/1004 |
| | | | 711/E12.001 |
| 2014/0133246 A1* | 5/2014 | Kumar | G11C 16/26 |
| | | | 365/230.03 |
| 2014/0189257 A1* | 7/2014 | Aritome | G11C 16/3427 |
| | | | 711/147 |
| 2014/0323046 A1 | 10/2014 | Asai et al. | |
| 2015/0016172 A1* | 1/2015 | Loh | G06F 3/0608 |
| | | | 365/51 |
| 2015/0121052 A1* | 4/2015 | Emma | G06F 9/44 |
| | | | 713/1 |
| 2015/0213860 A1* | 7/2015 | Narui | G11C 7/10 |
| | | | 365/51 |
| 2015/0228584 A1 | 8/2015 | Huang et al. | |
| 2015/0355763 A1* | 12/2015 | Miyake | G06F 3/0446 |
| | | | 345/174 |
| 2016/0111386 A1 | 4/2016 | England et al. | |
| 2016/0181214 A1* | 6/2016 | Oh | H01L 27/222 |
| | | | 257/777 |
| 2016/0225431 A1 | 8/2016 | Best et al. | |
| 2016/0233134 A1 | 8/2016 | Lim et al. | |
| 2016/0329312 A1 | 11/2016 | O'Mullan et al. | |
| 2016/0379115 A1 | 12/2016 | Burger et al. | |
| 2017/0092615 A1 | 3/2017 | Oyamada | |
| 2017/0092616 A1 | 3/2017 | Su et al. | |
| 2017/0148737 A1 | 5/2017 | Fasano et al. | |
| 2017/0154655 A1* | 6/2017 | Seo | G11C 8/06 |
| 2017/0194038 A1* | 7/2017 | Jeong | H01L 25/0657 |
| 2017/0213787 A1 | 7/2017 | Alfano et al. | |
| 2017/0278213 A1 | 9/2017 | Eckert et al. | |
| 2017/0278789 A1 | 9/2017 | Chuang et al. | |
| 2017/0285584 A1 | 10/2017 | Nakagawa et al. | |
| 2017/0301625 A1 | 10/2017 | Mahajan et al. | |
| 2018/0005697 A1* | 1/2018 | Park | G11C 5/04 |
| 2018/0017614 A1 | 1/2018 | Leedy | |
| 2018/0047432 A1* | 2/2018 | Kondo | G11C 7/1006 |
| 2018/0286800 A1 | 10/2018 | Kamal et al. | |
| 2018/0330992 A1 | 11/2018 | Delacruz et al. | |
| 2018/0330993 A1 | 11/2018 | Delacruz et al. | |
| 2018/0331037 A1 | 11/2018 | Mohammed et al. | |
| 2018/0331038 A1 | 11/2018 | Delacruz et al. | |
| 2018/0331072 A1 | 11/2018 | Nequist et al. | |
| 2018/0331094 A1 | 11/2018 | Delacruz et al. | |
| 2018/0331095 A1 | 11/2018 | Delacruz et al. | |
| 2018/0350775 A1 | 12/2018 | Delacruz et al. | |
| 2018/0373975 A1 | 12/2018 | Yu et al. | |
| 2018/0374788 A1 | 12/2018 | Nakagawa et al. | |
| 2019/0042377 A1 | 2/2019 | Teig et al. | |
| 2019/0042912 A1 | 2/2019 | Teig et al. | |
| 2019/0042929 A1 | 2/2019 | Teig et al. | |
| 2019/0043832 A1 | 2/2019 | Teig et al. | |
| 2019/0051641 A1 | 2/2019 | Lee et al. | |
| 2019/0109057 A1 | 4/2019 | Hargan et al. | |
| 2019/0115052 A1* | 4/2019 | Seong | G11C 5/04 |
| 2019/0123022 A1 | 4/2019 | Teig et al. | |
| 2019/0123023 A1* | 4/2019 | Teig | H01L 24/80 |
| 2019/0123024 A1 | 4/2019 | Teig et al. | |
| 2019/0146870 A1* | 5/2019 | Cha | H03M 13/2906 |
| | | | 714/755 |
| 2019/0244933 A1 | 8/2019 | Or-Bach et al. | |
| 2019/0278511 A1* | 9/2019 | Lee | G11C 7/1066 |
| 2019/0287584 A1* | 9/2019 | Hollis | H01L 25/0657 |
| 2019/0363098 A1* | 11/2019 | Lung | G11C 13/0026 |
| 2019/0371391 A1* | 12/2019 | Cha | G06F 11/106 |
| 2020/0013699 A1 | 1/2020 | Liu et al. | |
| 2020/0194052 A1 | 6/2020 | Shaeffer et al. | |
| 2020/0203318 A1 | 6/2020 | Nequist et al. | |
| 2020/0219771 A1 | 7/2020 | DeLaCruz et al. | |
| 2020/0227389 A1 | 7/2020 | Teig et al. | |
| 2020/0273798 A1 | 8/2020 | Mohammed et al. | |
| 2020/0293872 A1 | 9/2020 | Teig et al. | |
| 2020/0294858 A1 | 9/2020 | Delacruz et al. | |

FOREIGN PATENT DOCUMENTS

| | | |
|---|---|---|
| SG | 153683 A1 | 7/2009 |
| TW | I441308 B | 6/2014 |
| WO | 2017138121 A1 | 8/2017 |
| WO | 2019079625 A1 | 4/2019 |
| WO | 2019079631 A1 | 4/2019 |

OTHER PUBLICATIONS

Author Unknown, "Vector Supercomputer SX Series: SX-Aurora TSUBASA," Oct. 2017, 2 pages, NEC Corporation.

Bansal, Samta, "3D-IC is Now Real: Wide-IO is Driving 3D-IC TSV," Cadence Flash Memory Summit, Aug. 2012, 14 pages, Cadence Design Systems, Inc.

Black, Bryan, "Die Stacking is Happening!," Dec. 9, 2013, 53 pages, Advanced Micro Devices, Inc., Santa Clara, California.

Black, Bryan, et al., "3D Processing Technology and its Impact on iA32 Microprocessors," Proceedings of 2004 IEEE International Conference on Computer Design: VLSI in Computers and Processors, Oct. 11-13, 2004, 3 pages, IEEE, San Jose, California.

Black, Bryan, et al., "Die Stacking (3D) Microarchitecture," Proceedings of the 39th Annual IEEE/ACM International Symposium on Microarchitecture, Dec. 9-13, 2006, 11 pages, IEEE, Oriando, Florida.

Hajkazemi, Mohammad Hossein, et al., "Wide I/O or LPDDR? Exploration and Analysis of Performance, Power and Temperature Trade-offs of Emerging DRAM Technologies in Embedded MPSoCs," Proceedings of 33rd IEEE International Conference on Computer Design (ICCD), Oct. 18-21, 2015, 8 pages, IEEE, New York City, New York.

International Search Report and Written Opinion of Commonly Owned International Patent Application PCT/US2018/056559 (XCEL. P0047PCT), dated Mar. 29, 2019, 17 pages, International Searching Authority (European Patent Office).

International Search Report and Written Opinion of Commonly Owned International Patent Application PCT/US2018/056565 (XCEL. P0017PCT), dated Apr. 2, 2019, 17 pages, International Searching Authority (European Patent Office).

Kim, Jung-Sik, et al., "A 1.2 V 12.8 GB/s 2 GB Mobile Wide-I/O DRAM With 4x128 I/Os Using TSV Based Stacking," IEEE Journal of Solid-State Circuits, Jan. 2012, 10 pages, vol. 47, No. 1, IEEE.

Loh, Gabriel H., et al., "Processor Design in 3D Die-Stacking Technologies," IEEE Micro, May-Jun. 2007, 18 pages, vol. 27, Issue 3, IEEE Computer Society.

Nakamoto, Mark, et al., "Simulation Methodology and Flow Integration for 3D IC Stress Management," 2010 IEEE Custom Integrated Circuits Conference, Sep. 19-22, 2010, 4 pages, IEEE, San Jose, CA, USA.

Tran, Kevin, et al., "Start Your HBM/2.5D Design Today," High-Bandwidth Memory White Paper, Mar. 29, 2016, 6 pages, Amkor Technology, Inc., San Jose, CA, USA.

Wu, Xiaoxia, et al., "Electrical Characterization for Intertier Connections and Timing Analysis for 3-D ICs," IEEE Transactions on Very Large Scale Integration (VLSI) Systems, Dec. 6, 2010, 5 pages, IEEE.

"Hybrid Memory Cube—HMC Gen2 HMC Memory Features", Micron Technology, Inc., 2018, pp. 1-105.

(56) References Cited

OTHER PUBLICATIONS

Lin, F., et al., "Memory Interface Design for Hybrid Memory Cube (HMC)", IEEE, 2016, pp. 1-5.
Patti, Bob, "A Perspective on Manufacturing 2.5/3D", IEEE 3D System Integration Conference, 2013, pp. 1-30.
Pawlowski, J. Thomas, "Hybrid Memory Cube (HMC)", Micron Technology, Inc., Aug. 4, 2011, pp. 1-24.
Sangki, Hong, "3D Super-Via for Memory Applications", Micro-Systems Packaging Initiative (MSPI) Packaging Workshop, Jan. 31, 2007, pp. 1-35.

\* cited by examiner

3D MEMORY CIRCUIT

BACKGROUND

Electronic circuits are commonly fabricated on a wafer of semiconductor material, such as silicon. A wafer with such electronic circuits is typically cut into numerous dies, with each die being referred to as an integrated circuit (IC). Each die is housed in an IC case and is commonly referred to as a microchip, "chip," or IC chip. According to Moore's law (first proposed by Gordon Moore), the number of transistors that can be defined on an IC die will double approximately every two years. With advances in semiconductor fabrication processes, this law has held true for much of the past fifty years. However, in recent years, the end of Moore's law has been prognosticated as we are reaching the maximum number of transistors that can possibly be defined on a semiconductor substrate. Hence, there is a need in the art for other advances that would allow more transistors to be defined for an IC chip.

BRIEF SUMMARY

Some embodiments provide a three-dimensional (3D) circuit that has multiple stacked IC dies, with a memory circuit that spans two or more of the stacked IC dies. In some embodiments, the memory circuit includes a memory block on one die and data lines for the memory block on another IC die. For instance, in some embodiments, the 3D circuit includes a first IC die with a first set of two or more memory blocks that have a first set of data lines. The 3D circuit also includes a second IC die that is stacked with the first IC die and that includes a second set of two or more memory blocks with a second set of data lines.

The 3D circuit further includes a third IC die that is stacked with the first and second IC dies and that includes a third set of data lines, which connect through several z-axis connections with the first and second sets of data lines to carry data to and from the first and second memory block sets when data is being written to and read from the first and second memory block sets. The z-axis connections in some embodiments electrically connect circuit nodes in overlapping portions of the first and third IC dies, and overlapping portions of second and third IC dies, in order to carry data between the third set of data lines on the third IC die and the first and second set of data lines of the first and second memory block sets on the first and second IC dies. These z-axis connections between the dies are very short as the dies are very thin. For instance, in some embodiments, the z-axis connections are less than 10 or 20 microns. The z-axis connections are through silicon vias (TSVs) in some embodiments.

In some embodiments, the first and second memory block sets are part of a single addressable memory circuit, while in other embodiments these memory block sets are part of multiple, separately addressable memory circuits (e.g., the first memory block set is part of a first addressable memory circuit, while the second memory block set is part of a different, second addressable memory circuit). The set of one or more memory circuits formed by the first and second memory block sets in some embodiments include (1) a set of addressing circuits to activate different addressed locations in the memory blocks, and (2) a set of input/output (I/O) circuits to write/read data to addressed locations in the memory blocks.

In some embodiments, the addressing circuits are implemented at least partially on the first and second dies, while the I/O circuits are implemented at least partially on the third die. For instance, in some embodiments, the addressing circuits include sense amplifiers and bit lines defined on the first and second dies. The first and second memory block sets have numerous bit lines that connect their respective storage cells to their respective first and second data line sets through sense amplifiers that amplify the values stored in the storage cells.

In some embodiments, the I/O circuits include the third data line sets on the third die, which connect to the first and second data line sets. In some of these embodiments, the I/O circuit set further include a set of buffers defined on the third die. Different buffers are used in different embodiments. Examples of such buffers include inverters, level shifters, stateful storage circuits (e.g., latches, flip flops, etc.), etc. In some embodiments, compute circuits are defined on the third die, and these compute circuits receive through the I/O circuits on the third die the data that is read from the first and second memory blocks. In some of these embodiments, these compute circuits also provide to the I/O circuits data that is to be written to the first and second memory blocks. In some embodiments, these compute circuits are processing cores that implement machine-trained nodes (e.g., neurons) of a machine trained network (e.g., a neural network).

The preceding Summary is intended to serve as a brief introduction to some embodiments of the invention. It is not meant to be an introduction or overview of all inventive subject matter disclosed in this document. The Detailed Description that follows and the Drawings that are referred to in the Detailed Description will further describe the embodiments described in the Summary as well as other embodiments. Accordingly, to understand all the embodiments described by this document, a full review of the Summary, Detailed Description, the Drawings and the Claims is needed.

BRIEF DESCRIPTION OF THE DRAWINGS

The novel features of the invention are set forth in the appended claims. However, for purposes of explanation, several embodiments of the invention are set forth in the following figures.

DETAILED DESCRIPTION

Figure 1:
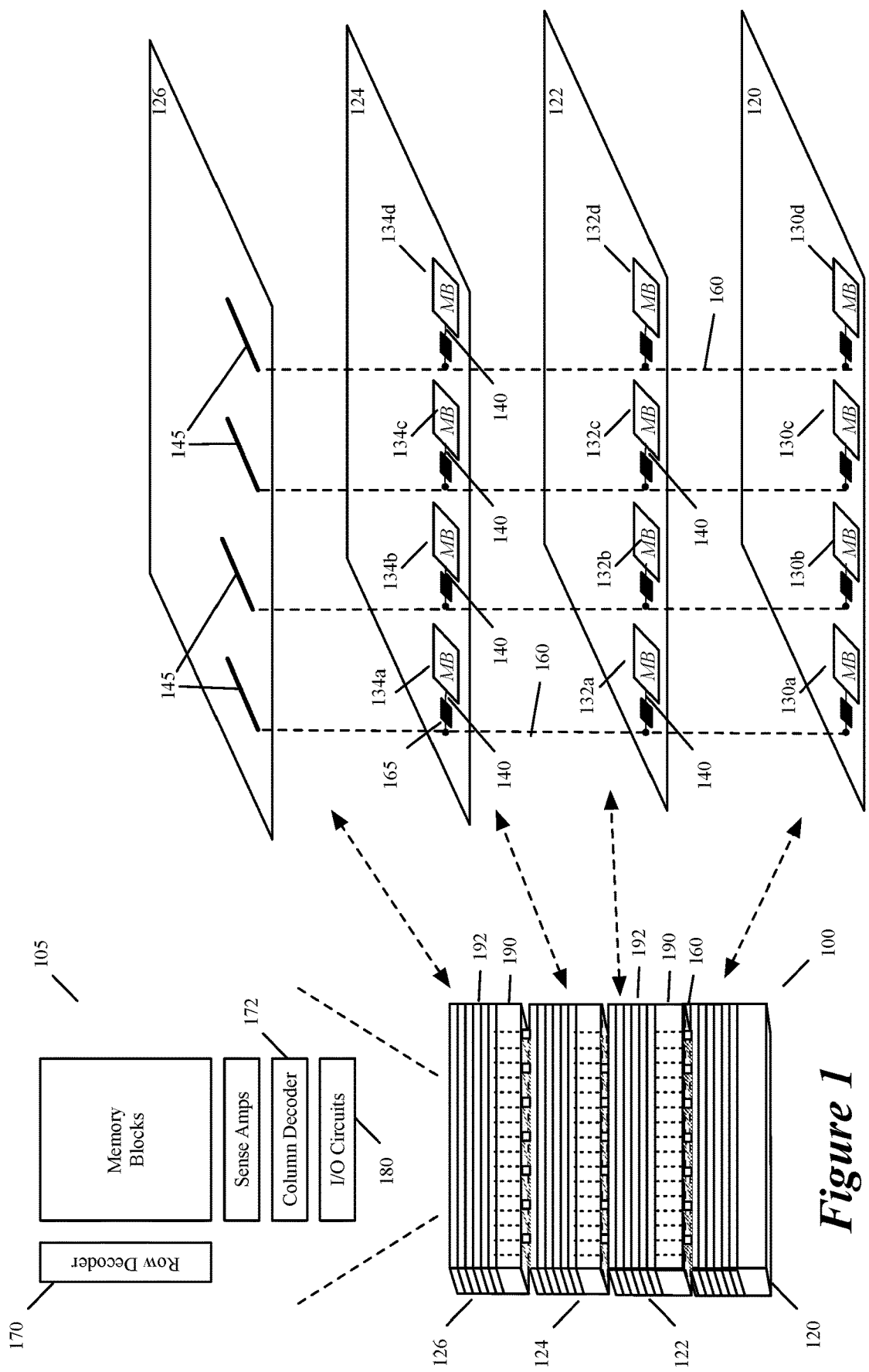
FIG. 1 illustrates a 3D circuit of some embodiments of the invention.

In the following detailed description of the invention, numerous details, examples, and embodiments of the invention are set forth and described. However, it will be clear and apparent to one skilled in the art that the invention is not limited to the embodiments set forth and that the invention may be practiced without some of the specific details and examples discussed.

Some embodiments provide a three-dimensional (3D) circuit that has multiple stacked IC dies, with a memory circuit that spans two or more of the stacked IC dies. In some embodiments, the memory circuit includes a memory block on one die and data lines for the memory block on another IC die. For instance, in some embodiments, the 3D circuit includes a first IC die with a first set of two or more memory blocks that have a first set of data lines. The 3D circuit also includes a second IC die that is stacked with the first IC die and that includes a second set of two or more memory blocks with a second set of data lines. The 3D circuit further includes a third IC die that is stacked with the first and second IC dies and that includes a third set of data lines, which connect through several z-axis connections with the first and second sets of data lines to carry data to and from the first and second memory block sets when data is being written to, and read from, the first and second memory block sets.

In some embodiments, the first and second memory block sets form a single addressable memory circuit, while in other embodiments these memory block sets are part of multiple, separately addressable memory circuits (e.g., the first memory block set is part of a first addressable memory circuit, while the second memory block set is part of a different, second addressable memory circuit). Examples of such memory circuits include DRAMs (Dynamic Random Access Memories), SRAMs (Static Random Access Memories), ROMs (Read Only Memories), etc.

The set of one or more memory circuits formed by the first and second memory block sets in some embodiments include (1) a set of addressing circuits to activate different addressed locations in the memory blocks, and (2) a set of input/output (I/O) circuits to write/read data to addressed locations in the memory blocks. In some embodiments, the addressing circuits are implemented at least partially on the first and second dies, while the I/O circuits are implemented at least partially on the third die. For instance, in some embodiments, the addressing circuits include sense amplifiers defined on the first and second dies, while the I/O circuits include the third data line sets on the third die, which connect to the first and second data line sets. In some of these embodiments, the I/O circuit set further includes a set of buffers defined on the third die. Different buffers are used in different embodiments. Examples of such buffers include inverters, level shifters, stateful storage circuits (e.g., latches, flip flops, etc.), etc.

In the discussion above and below, the connections that cross bonding layers (that bond vertically stacked dies) to electrically connect electrical nodes (e.g., circuit points, etc.) on different dies are referred to below as z-axis connections. This is because these connections traverse completely or mostly in the z-axis of the 3D circuit (e.g., because these connections in some embodiments cross the bonding layer(s) in a direction normal or nearly normal to the bonded surface), with the x-y axes of the 3D circuit defining the planar surface of the IC die substrate or interconnect layers. These connections are also referred to as vertical connections to differentiate them from the horizontal planar connections along the interconnect layers of the IC dies.

Through silicon vias (TSVs) are one example of z-axis connections used by some embodiments of the invention. In some embodiments, z-axis connections are native interconnects that allow signals to span two different dies with no standard interfaces and no input/output protocols at the cross-die boundaries. In other words, the direct bonded interconnects allow native signals from one die to pass directly to the other die with no modification of the native signal or negligible modification of the native signal, thereby forgoing standard interfacing and consortium-imposed input/output protocols. In some embodiments, z-axis connections are direct unbuffered electrical connections (i.e., connections that do not go through any buffer or other circuit).

A z-axis connection between two dies terminates typically on electrical contacts (referred to as pads) on each die (e.g., on an interconnect or substrate layer of each die). Through interconnect lines and/or vias on each die, the z-axis connection pad on each die electrically connects the z-axis connection with circuit nodes on the die that need to provide the signal to the z-axis connection or to receive the signal from the z-axis connection. For instance, a z-axis connection pad connects to an interconnect segment on an interconnect layer of a die, which then carries the signal to a circuit block on the die's substrate through a series of vias and interconnect lines. Vias are z-axis structures on each die that carry signals between the interconnect layers of the die, and between the IC die substrate and the interconnect layers of the die.

The discussion above and below refers to different circuits or blocks on different dies overlapping with each other. As illustrated in the figures described below, two circuit blocks on two vertically stacked dies overlap when their horizontal cross sections (i.e., their horizontal footprint) vertically overlap (i.e., have an overlap in the vertical direction).

FIG. 1 illustrates a 3D circuit 100 of some embodiments of the invention. The 3D circuit 100 has a memory circuit 105 with different components on different IC dies. Specifically, the 3D circuit 100 includes four dies 120-126 that are vertically stacked on top of each other. To vertically stack these dies on top of each other, some embodiments use commonly known techniques for aligning dies vertically and bonding neighboring dies through a bonding layer. As further described below, some embodiments use z-axis connections 160 (e.g., connections that are orthogonal to the x-y surface of the dies) to electrically connect nodes on vertically mounted dies.

In FIG. 1, the first IC die 120 includes a first set of four memory blocks 130, the second IC die 122 includes a second set of four memory blocks 132, and the third IC die 124 includes a third set of four memory blocks 134. The memory blocks in each of these three dies 120-124 are arranged in a single direction (e.g., a single row or single column), with the cross section of each block (e.g., block 130d on die 120) on each die overlapping the cross section of two other memory blocks on two other dies (e.g., blocks 132d and 134d on dies 122 and 124). In other words, each memory block on one die is vertically aligned with two other memory blocks on two other dies in this example. In other embodiments, the memory blocks are not so aligned, and/or have a different arrangement on each die (e.g., are arranged in a two-dimensional array).

In some embodiments, each die includes a semiconductor substrate 190 and a set of interconnect layers 192 defined above the semiconductor substrate. On each die, numerous electronic components (e.g., active components, like transistors and diodes, or passive components, like resistors and capacitors) are defined on that die's semiconductor substrate, and are connected to each other through interconnect wiring on the die's set of interconnect layers, in order to form storage cells, microcircuits (e.g., Boolean gates, such as AND gates, OR gates, etc.) and/or larger circuit blocks (e.g., functional blocks, such as memories, decoders, logic units, multipliers, adders, etc.). For instance, in some embodiments, each memory block on each die is defined on that die's semiconductor substrate with the needed interconnect wiring on the die's set of interconnect layers.

Each memory block has a set of local data lines 140 on the same IC die as the memory block. The local data lines 140 of each memory block carry data read from, and written to, the memory block. These local data lines 140 of each memory block connect to global data lines 145 on the fourth IC die 126 through control circuits 165 and z-axis connections 160. As shown, the memory circuit has several sets of global data lines 145 on the fourth IC die 126, with each set of global data lines used by a different set of overlapping memory blocks on the first, second and third IC dies 120-124.

In some embodiments, the global data lines 145 include wiring that is defined on one or more interconnect layers of the fourth IC die 126. The global data lines 145 provide the data read from the memory blocks to the I/O circuits 180 (e.g., circuits on the fourth IC die 126) of the memory circuit 105, and provide data to write to the memory blocks from the I/O circuits 180. In some embodiments, the I/O circuits 180 are implemented at least partially on the fourth die 126. For instance, the I/O circuits in some embodiments include buffer circuits (e.g., inverters, level shifters, stateful storage circuits (e.g., latches, flip flops, etc.), etc.) that are defined on the fourth IC die 126.

The z-axis connections 160 in some embodiments electrically connect circuit nodes in overlapping portions of the local data lines 140 and global data lines 145, in order to carry data between the global data lines and the local data lines. These z-axis connections between the dies are very short as the dies are very thin. For instance, in some embodiments, the z-axis connections are less than 10 or 20 microns. The z-axis connections are through silicon vias (TSVs) in some embodiments.

The memory circuit 105 has row and column addressing circuits 170 and 172 that activate a set of addressed locations in a set of memory blocks based on addresses that the receive from other circuits of the 3D circuit 100. In some embodiments, the memory circuit 105 has different row and column addressing sub-circuits for each memory block that process the received addresses for that memory block. In some embodiments, each memory block's row and column addressing sub-circuits are at least partially defined on that block's die. For instance, as further described below, the addressing sub-circuits of each memory block in some embodiments include sense amplifiers and bit lines that are defined on the memory block's die. In some embodiments, the bit lines of the memory block connect the block's storage cells to their respective block's local data lines through sense amplifiers that amplify the values stored in the storage cells.

Figure 2:
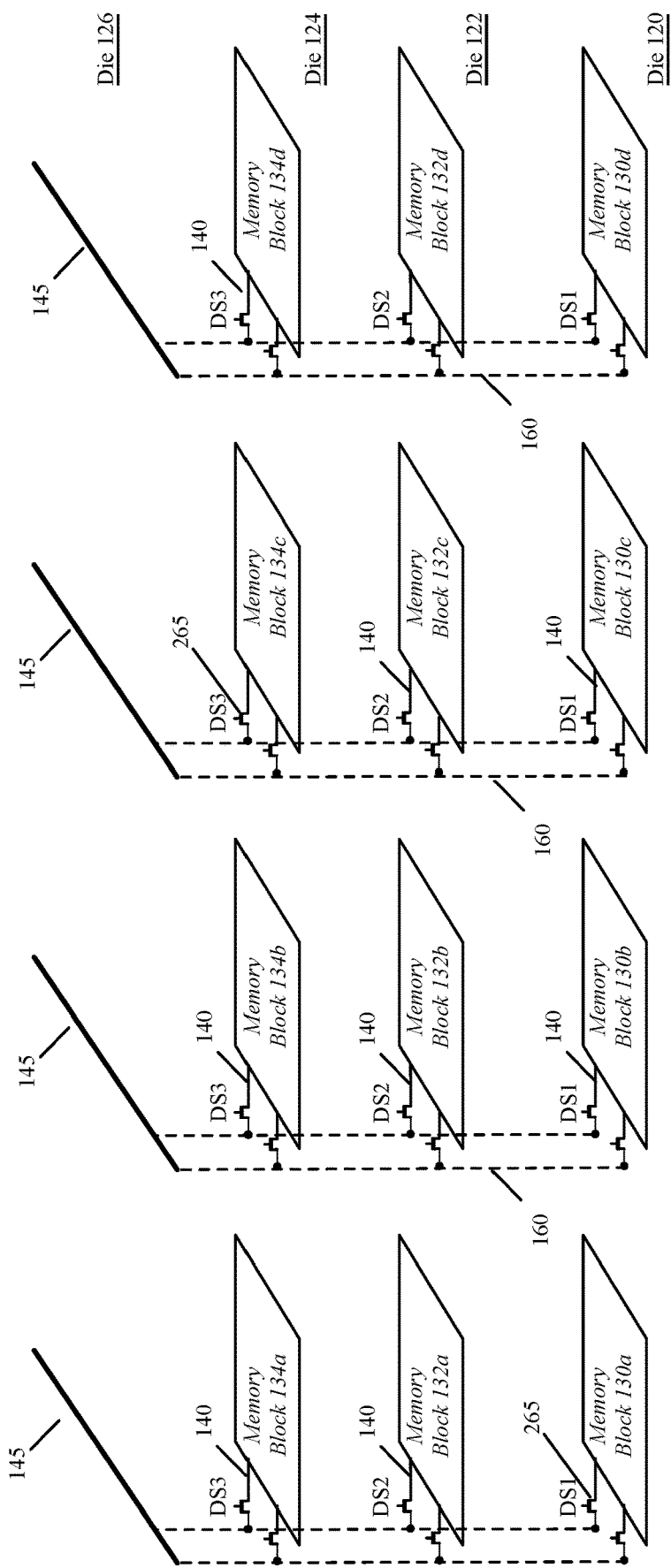
FIG. 2 illustrates another perspective view of the components of the memory circuit of FIG. 1.

FIG. 2 illustrates another perspective view of the memory blocks 130-134, the local data lines 140 and global data lines 145 of the memory circuit 105. In this view, the memory circuit 105 is a DRAM that is implemented with a differential logic design. This view illustrates the four memory blocks on each of the first three dies 120-124, with each memory block vertically overlapping two other memory blocks on two other dies and each set of three vertically overlapping memory blocks on the three dies 120-124 sharing one set of global data lines 145. Specifically, it shows the local data lines 140 of each memory block connected through pass gate controls 265 (serving as the control circuits 165) and z-axis connections 160 to the global data lines 145. It further shows the four sets of global data lines 145 for the four sets of overlapping memory blocks on the first, second and third IC dies 120-124.

Each memory block's set of local data lines 140 has two subsets of complementary local data lines (as the design is a differential design), with each subset having several (e.g., 8, 16, 32, 64, etc.) data lines. Similarly, each pass gate control 265 of the memory block has two subset of pass gates for the two subsets of local data lines, with each subset of pass gates having several (e.g., 8, 16, 32, 64, etc.) pass gates.

In FIG. 2, the pass gate controls 265 receive die select signals that at any given time, activate the pass gate controls for the memory blocks of just one die. For example, for one set of address values, the pass gate controls 265 of the first IC die 120 would receive an active die select signals DS1 that would turn on their transistors to connect their local data lines 140 to the global data lines 145, while the other pass gate controls 265 of the other IC dies 122 and 124 would not receive active die select signals DS2 and DS3.

A given address in these embodiments would cause each of the memory blocks on one IC die (e.g., the first IC die) to read from or write to one set of storage locations. Hence, under this approach, a large amount of data can be read from, or written to, addressed sets of locations in the memory blocks on one IC die (e.g., the first IC die) concurrently through the local data lines 140 of the memory blocks, their associated pass gate controls 265, and the different sets of global data lines 145.

In this concurrent accessing scheme, the access to any one memory block on a die is not blocked by the concurrent access of another memory block on the die as the different memory blocks on the same die connect to different global data lines. Also, in this scheme, the global data lines do not have to span all the memory blocks on a given die, and hence have a shorter length than global data lines that are typically used today to span a row or column of memory blocks on a single die. In some embodiments, the span of the global data lines is one length, or less than one length, of a memory block, as each set of global data lines is used for three overlapping memory blocks that have the same footprint (i.e., cross section). Hence, each set of global data lines needs to be long enough to provide sufficient space for connecting to the z-axis connections from the memory blocks.

The short span of the global data lines is highly advantageous when the memory circuit has a large number of memory blocks (e.g., 8, 16, etc.). In the memory block arrangement illustrated in FIG. 2, the length of the wire and z-axis connections between each memory block's local data lines 140 and its corresponding global data lines 145 is rather short, as the global data lines traverse over the local data lines very near to the memory blocks, and the z-axis connections are very short.

For a given address, the memory circuit 105 in some embodiments sequentially activates the die select signals of the different dies so that after concurrently reading from or writing to addressed locations in all the memory blocks of one die, the memory circuit can then read from or write to the addressed locations of the memory block of other die(s). For instance, in the above-described example, after reading from or writing to the set of address locations in the memory blocks of the first IC die 120, the memory circuit sequentially provides active die select signals to the pass gate controls of the second and third IC dies 122 and 124 so that it can sequentially read from or write to the set of address locations in the memory blocks of the second IC die 122 followed by the set of address locations in the memory blocks of the third IC dies 124. In other embodiments, the memory circuit 105 has other schemes for activating the pass gate controls and accessing the memory blocks on different IC dies, as further described below by reference to FIG. 4.

Figure 3:
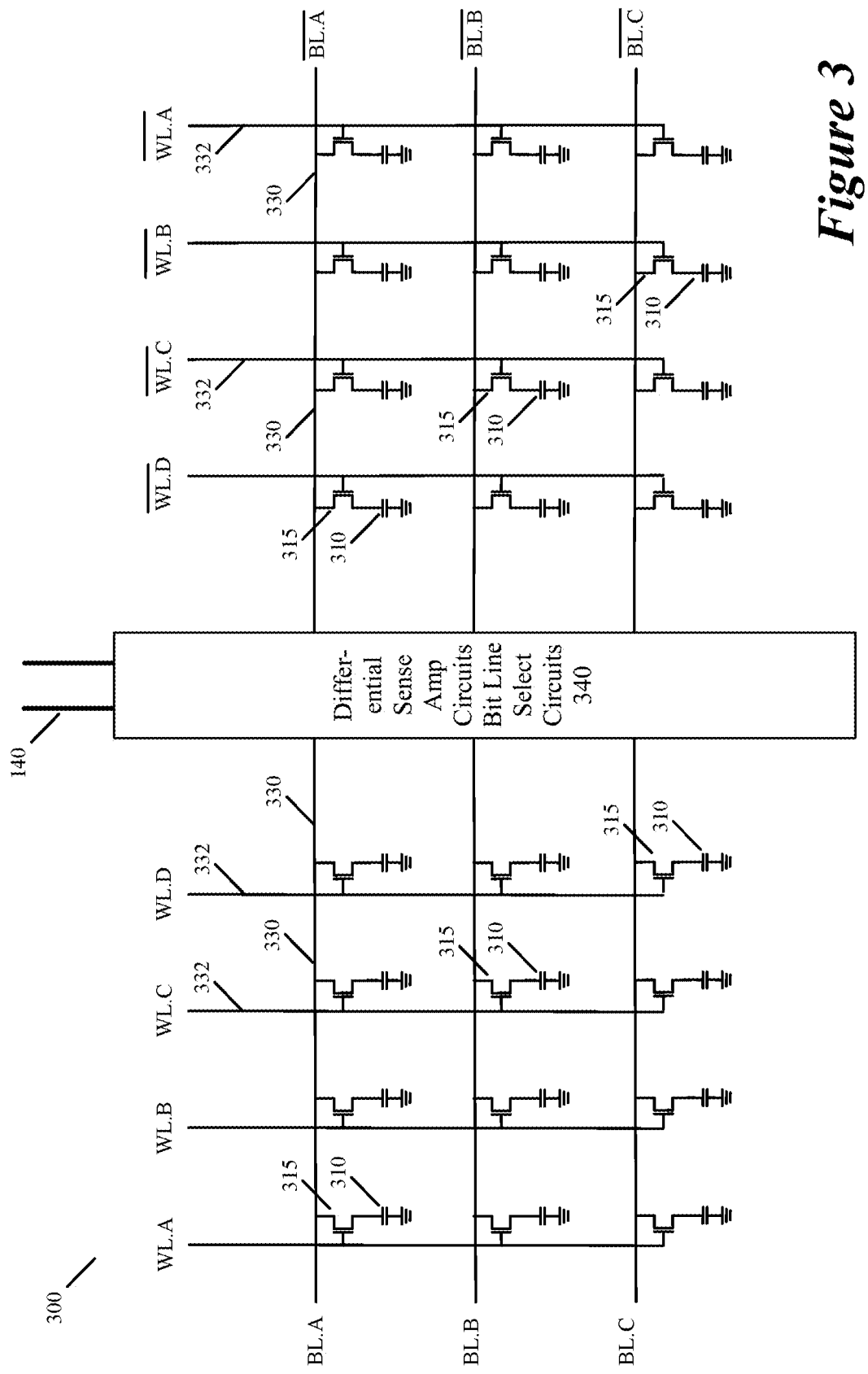
FIG. 3 illustrates the structure of a DRAM memory block that can be used to implement the memory blocks of FIG. 1.

FIG. 3 illustrates the structure of a DRAM memory block 300 that can be used to implement the memory blocks 130, 132 and 134 when the memory circuit is a DRAM. The memory block 300 has a commonly used differential design that is used in many DRAMs today. In this design, each logical storage cell is implemented by a complementary pair of single physical storage cells 310 (e.g., single capacitors) that are accessed through complementary pass gate transistors 315, word lines and bit lines. Each cell's pass gate transistor connects to a bit line, a word line and the cell. The bit and word lines 330 and 332 that connect to the cell's pass gate transistor are complimentary (i.e., carry the opposite signal values) to the bit and word lines that connect to that cell's complimentary cell.

Specifically, each particular pass gate transistor 315 of each particular cell has its gate connected to a particular word line, while a word line that is complementary to the particular word line connects to the gate of the pass gate transistor of a cell that is the complementary cell to the particular cell. Similarly, each particular pass gate transistor 315 of each particular cell has one of its second terminal connected to a particular bit line, while a bit line that is complementary to the particular bit line connects to the second terminal of the pass gate transistor of the complementary cell of the particular cell. Lastly, each pass gate transistor's third terminal connects to its storage cell. Hence, in this design, several storage locations in a memory block can be accessed concurrently by activating (i.e., by providing active signals on) complimentary word line pairs of the storage locations, so that data can be read from, or written through, the complimentary bit line pairs of the storage locations.

Each pair of complementary bit lines are fed to a differential sense amplifier circuit 340 that amplifies the differential voltage value read from a complementary pair of cells by the bit lines, in order to quickly move the data to the high and low rail values. In some embodiment, each differential pair of cells has one cell store a high or low value, while the other stores the opposite value or a mid-range value. In these embodiments, the sense amplifiers quickly move the data values to the desired rail values to address any degradation in stored values, or to address the storage of the mid-range value.

The sense amplifier circuits 340 includes several differential sense amplifiers (e.g., one for each bit line pair, or one for each several bit lines pairs). In some embodiments, each differential sense amplifier is formed as a gated, cross coupled latch. The bit lines in some embodiments connect to the local data lines 140 of the memory circuit through column addressing controls (not shown) of the column addressing circuit of the memory circuit. With the exception of the z-axis connections, all the components illustrated in FIG. 3 (i.e., the bit and word lines 330 and 332, the local data lines 140, the storage cells 310, the pass gate transistors 315, the sense amplifier circuits 340) in some embodiments are defined entirely on one of the dies 120, 122 or 124.

Figure 4:
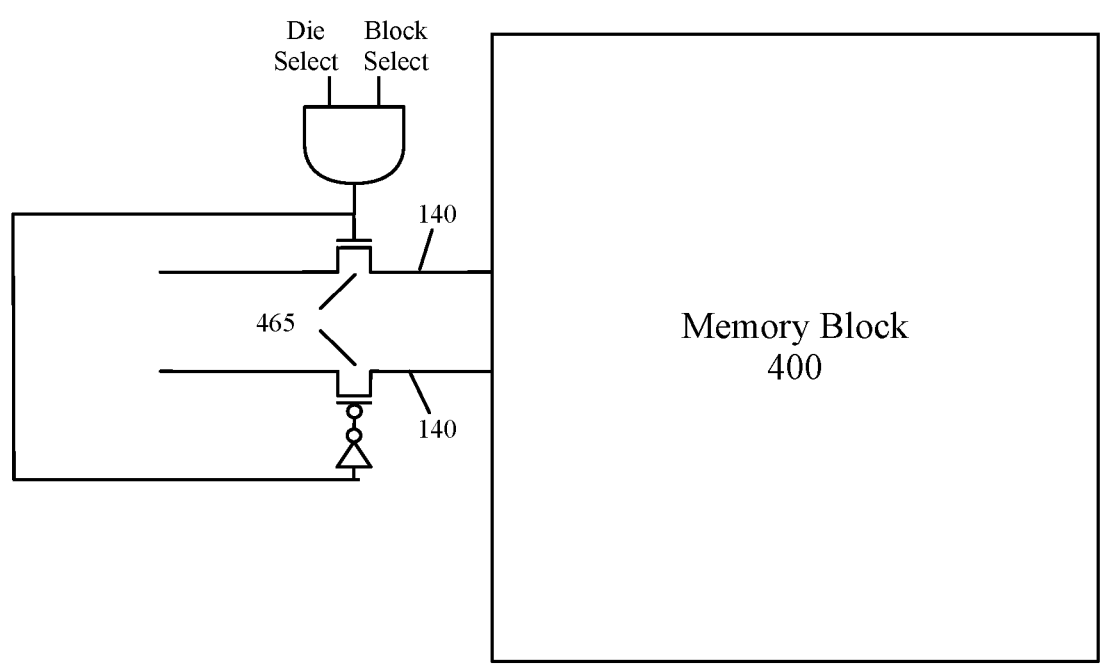
FIG. 4 illustrates an example where the pass gate transistors of a memory block are controlled by AND'ing a die select signal and a block select signal.

Instead of controlling the pass gate transistors 265 with die select signals, other embodiments control these pass gate transistors 265 differently. For instance, FIG. 4 illustrates an example where the pass gate transistors 465 of a memory block 400 (e.g., memory block 130, 132 or 134) are controlled by AND'ing a die select signal and a block select signal. By specifying different die and block select signals for different memory blocks, the 3D memory circuit 105 can have any arbitrary combination of non-overlapping memory blocks connect their local data lines 140 to the global data lines 145 through the pass gate transistors 265 and the z-axis connections 160. For instance, for the example illustrated in FIG. 2, a particular combination of die and block select signals can result in the memory bocks 130a, 132b, and 134c outputting their results concurrently on their respective global data lines 145. Also, other embodiments use staggered sets of sense amplifiers such that consecutive bit lines in each set of bits lines are fed to different sense amplifiers (e.g., even complementary bit lines are fed to a sense amplifier to the right of the memory cells while odd complementary bit lines are fed to a sense amplifier to the left of the memory cells).

Figure 5:
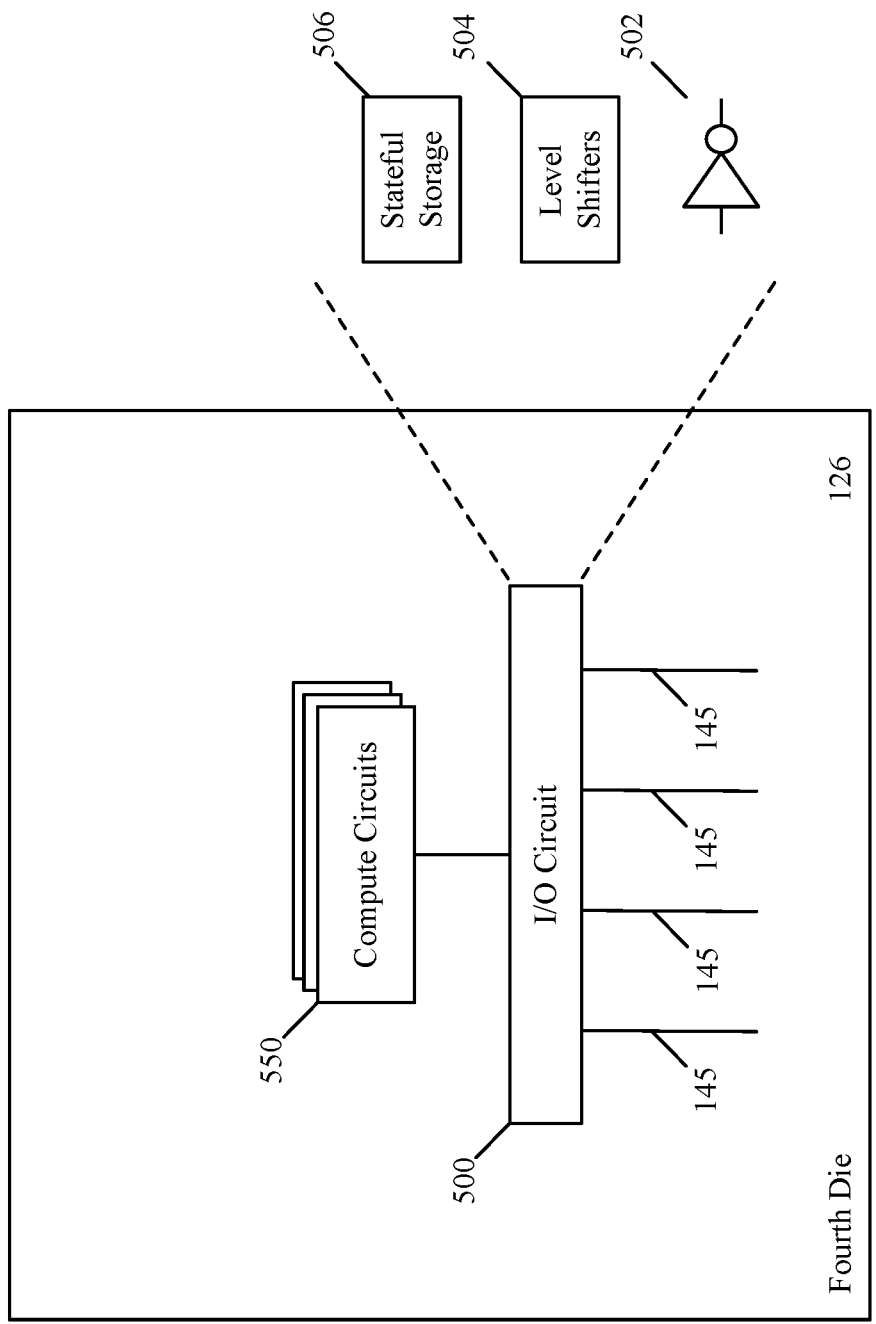
FIG. 5 illustrates buffer circuits of the I/O circuits defined on the fourth IC die of FIG. 1.

FIG. 5 illustrates buffer circuits 500 of the I/O circuits 180 defined on the fourth IC die 126 along with the global data lines 145. Different buffers are used in different embodiments. As shown, examples of such buffers include inverters 502, level shifters 504, stateful storage circuits 506 (e.g., latches, flip flops, etc.), etc. I/O circuits 180 of the memory circuit 105 receives data to store in the memory blocks from, and supply data read from the memory blocks to, circuit defined on the first, second, third and fourth dies IC 120-126. In some embodiments, these circuits include compute circuits 550 defined on the fourth IC die 126, as shown in FIG. 5. In some embodiments, these compute circuits on the fourth IC die 126 are processing cores that implement machine-trained nodes (e.g., neurons) of a machine trained network (e.g., a neural network), while the memory blocks store values used or computed by these compute circuits (e.g., weight values or activation values).

Other embodiments use other architectures to read data from or write data to the memory blocks 130-134 of the memory circuit 105. For instance, some embodiments have two sets of global data lines 145 for two opposing sides (e.g., right and left sets of global data lines) of each set of stacked memory blocks (e.g., memory blocks 130a, 132a, and 134a), instead of just having one set of global data lines 145 for each set of stacked memory blocks. Also, some embodiments also employ a multiplexer between the I/O circuit 500 and the compute circuits 550 to connect different subsets of global data lines with the compute circuits at different times. Both these approaches would increase the number of memory blocks that can be concurrently or sequentially accessed through the global data lines and the z-axis connections.

One of ordinary skill will also realize that while some embodiments have been described above by reference to the memory circuit 105, other embodiments of the invention can be implemented differently. For instance, in some embodiments, the memory blocks on one set of stacked IC dies that use the global data lines on another stacked IC die are part of two or more separately addressable memory circuits, instead of the single addressable memory circuit 105. Also, other embodiments use many more memory blocks and global data lines than the memory circuit 105.

For instance, instead of having four sets of overlapping memory blocks on three dies, the memory circuit of other embodiments has eight overlapping memory blocks on three dies. In these embodiments, the memory circuit has eight memory blocks on each of the three stacked dies 120, 122 and 124, and these twenty-four memory blocks form eight sets of three overlapping memory blocks on these dies. Each of these eight sets shares two sets of global data lines that connect to two sets of local data lines that emanate from two sides of each memory block. In addition, other embodiments have different sets of global data lines on different stacked IC dies (e.g., a first set of global data lines on IC die 126 for use by a first set of memory blocks on IC dies 120-124, and a second set of global data lines on IC die 120 for use by a second set of memory blocks on IC dies 122-126).

When all the blocks on one IC die are accessed concurrently through the global data lines, a very large amount of memory locations in the memory blocks on one die can be accessed concurrently. This number can be increased by three-fold when the memory circuit successively activates the die select signals on each of the three dies so that the memory blocks on each of the three dies can be successively accessed.

The four dies 120-126 of the 3D circuit 100 of FIG. 1 are face-to-back mounted, in that the set of interconnect layers of one die is mounted next to the backside of the semiconductor substrate of the other die. In this architecture, TSVs are used as the z-axis connections to carry signals from one die to another. The 3D circuit of other embodiments uses other techniques for vertically stacking the dies.

Figure 6:
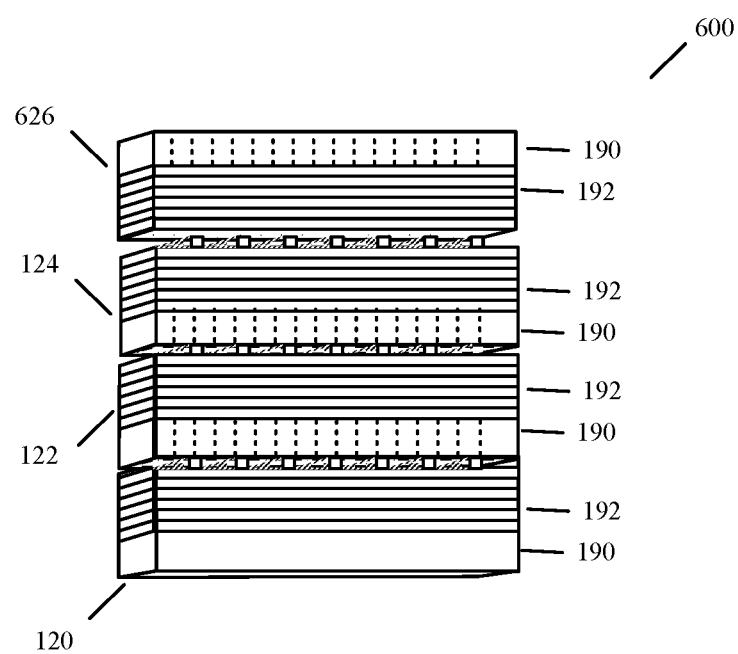
FIG. 6 illustrates another 3D circuit of some embodiments.

FIG. 6 illustrates one such alternative approach. It shows a 3D circuit 600 that, like the 3D circuit 100, has four vertically stacked dies, with the first three being face-to-back mounted. However, unlike the 3D circuit 100, the third and fourth dies 124 and 626 of the 3D circuit 600 are face-to-face stacked. In some embodiments, the die 626 is similar to the die 126 in that it includes the global data lines 145 discussed above. However, the die 626 in some embodiments has contacts that facilitate its face-to-face mounting to the die 124.

In FIG. 6, the sets of interconnect layers of the dies 124 and 626 are facing each other and are bonded to each other through a direct bonding process that establishes direct-contact metal-to-metal bonding, oxide bonding, or fusion bonding between these two sets of interconnect layers. An example of such bonding is copper-to-copper (Cu—Cu) metallic bonding between two copper conductors in direct contact. In some embodiments, the direct bonding is provided by a hybrid bonding technique such as DBI® (direct bond interconnect) technology, and other metal bonding techniques (such as those offered by Invensas Bonding Technologies, Inc., an Xperi Corporation company, San Jose, Calif.). In some embodiments, DBI connects span across silicon oxide and silicon nitride surfaces. The DBI process is further described in U.S. Pat. Nos. 6,962,835 and 7,485,968, both of which are incorporated herein by reference. This process is also described in U.S. Published Patent Application 2018/0102251, which is also incorporated herein by reference.

When the third and fourth dies 124 and 626 are face-to-face bonded, the back side of the fourth die 626 can be used to connect to a ball grid array, which is then used to mount the 3D circuit 600 on a board. Instead of just face-to-face mounting the two dies 124 and 626, other embodiments face-to-face mount two pairs of dies (e.g., dies 120 and 122 and dies 124 and 626) and then back-to-back mount one die from each of these pairs (e.g., dies 122 and 124). Back-to-back stacked dies have the backside of the semiconductor substrate of one die mounted next to the backside of the semiconductor substrate of the other die.

Figure 7:
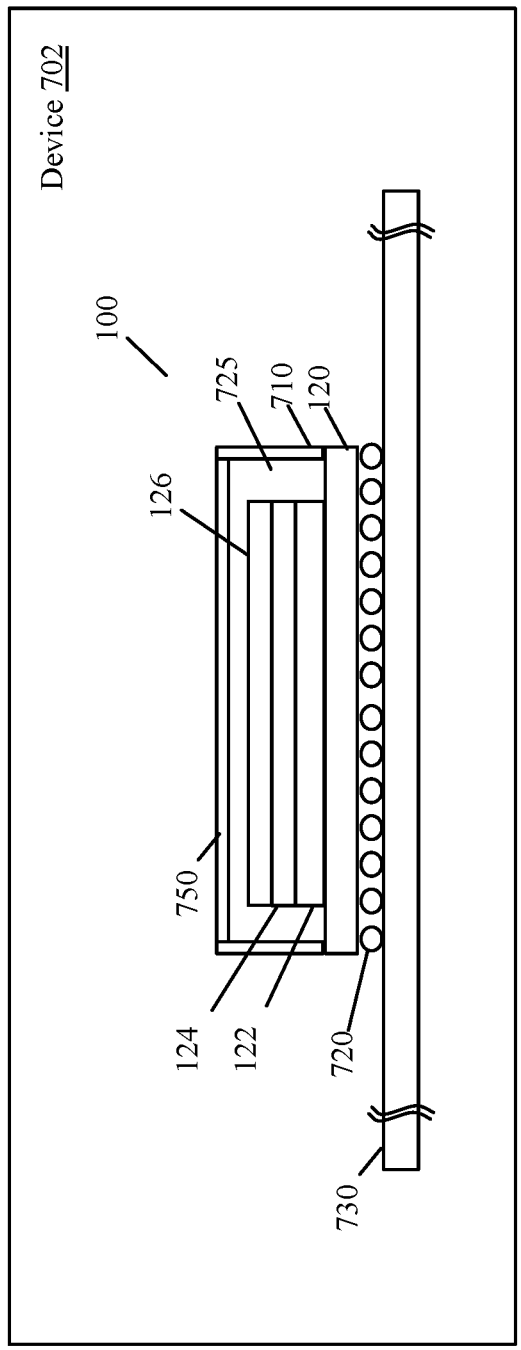
FIG. 7 illustrates a device that uses a 3D IC of some embodiments of the invention.

FIG. 7 illustrates a device 702 that uses a 3D IC 100. As shown, the 3D IC die 100 includes a cap 750 that encapsulates the four dies of this IC in a secure housing 725. On the back side of the die 120 one or more TSVs and/or interconnect layers are defined to connect the 3D IC to a ball grid array 720 (e.g., a micro bump array) that allows this to be mounted on a printed circuit board 730 of the device 702. The device 702 includes other components (not shown). In some embodiments, examples of such components include one or more memory storages (e.g., semiconductor or disk storages), input/output interface circuit(s), one or more processors, etc.

In some embodiments, the die 120 receives data signals through the ball grid array, and routes the received signals to I/O circuits on this and/or other dies through interconnect lines on the interconnect layer, vias between the interconnect layers, and z-axis connections with the other dies. As mentioned by reference to FIG. 6, other embodiments connect the backside of the substrate of the die 626 to the ball grid array.

While the invention has been described with reference to numerous specific details, one of ordinary skill in the art will recognize that the invention can be embodied in other specific forms without departing from the spirit of the invention. For instance, several embodiments were described above where the data from or to an I/O circuit is written to or read from memory blocks in parallel or concurrently. Other embodiments, however, have data that is read from a first memory block in an IC die written to a second memory block (e.g., a second memory block stacked with the first memory block or offset from the first memory block) through one z-axis connections, or through one set of z-axis connections, a set of global data lines and then another set of z-axis connections. Thus, one of ordinary skill in the art would understand that the invention is not to be limited by the foregoing illustrative details, but rather is to be defined by the appended claims.

The invention claimed is:

1. A three-dimensional (3D) circuit comprising:
 a first integrated circuit (IC) die comprising a first plurality of memory blocks with a first set of data lines;
 a second IC die stacked on top of the first IC die and comprising a second plurality of memory blocks with a second set of data lines;
 a third IC die stacked on top of the first and second IC dies and comprising a third set of data lines;
 a plurality of z-axis connections that connect the third set of data lines with the first and second sets of data lines to carry data to and from the first and second plurality of memory blocks when data is being written to, and read from, the first and second plurality of memory blocks, wherein a first z-axis connection of the plurality of z-axis connections extends through the second IC die in a z direction perpendicular to the second IC die and is coupled to a data line of the first set of data lines and a data line of the third set of data lines; and
 a set of memory circuits, comprising:
  a first individually addressable memory circuit comprising the first plurality of memory blocks,
  a second individually addressable memory circuit comprising the second plurality of memory blocks;
  a set of addressing circuits to activate different addressed locations in first and second pluralities of memory blocks; and
  a set of input/output (I/O) circuits to write/read data to addressed locations in the first and second pluralities of memory blocks, the I/O circuit set comprising the third set of data lines.

2. The 3D circuit of claim 1, wherein the addressing circuit set includes a set of sense amplifiers defined on the first and second IC dies.

3. The 3D circuit of claim 2, wherein the I/O circuit set comprises buffers defined on the third IC die.

4. A three-dimensional (3D) circuit comprising:
a first integrated circuit (IC) die comprising a first plurality of memory blocks with a first set of data lines;
a second IC die stacked on top of the first IC die and comprising a second plurality of memory blocks with a second set of data lines;
a third IC die stacked on top of the first and second IC dies and comprising a third set of data lines;
a plurality of z-axis connections that connect the third set of data lines with the first and second sets of data lines to carry data to and from the first and second plurality of memory blocks when data is being written to, and read from, the first and second plurality of memory blocks, wherein a first z-axis connection of the plurality of z-axis connections extends through the second IC die in a z direction perpendicular to the second IC die and is coupled to a data line of the first set of data lines and a data line of the third set of data lines; and
a set of one or more memory circuits, comprising:
the first and second plurality of memory blocks;
a set of addressing circuits to activate different addressed locations in the first and second plurality of memory blocks; and
a set of input/output (I/O) circuits to write/read data to addressed locations in the first and second plurality of memory blocks, the I/O circuit set comprising the third set of data lines, wherein
the addressing circuit set includes a set of sense amplifiers defined on the first and second IC dies, and
the I/O circuit set comprises level shifters defined on the third IC die.

5. A three-dimensional (3D) circuit comprising:
a first integrated circuit (IC) die comprising a first plurality of memory blocks with a first set of data lines;
a second IC die stacked on top of the first IC die and comprising a second plurality of memory blocks with a second set of data lines;
a third IC die stacked on top of the first and second IC dies and comprising a third set of data lines;
a plurality of z-axis connections that connect the third set of data lines with the first and second sets of data lines to carry data to and from the first and second plurality of memory blocks when data is being written to, and read from, the first and second plurality of memory blocks, wherein a first z-axis connection of the plurality of z-axis connections extends through the second IC die in a z direction perpendicular to the second IC die and is coupled to a data line of the first set of data lines and a data line of the third set of data lines; and
a set of one or more memory circuits, comprising:
the first and second plurality of memory blocks;
a set of addressing circuits to activate different addressed locations in the first and second plurality of memory blocks; and
a set of input/output (I/O) circuits to write/read data to addressed locations in the first and second plurality of memory blocks, the I/O circuit set comprising the third set of data lines, wherein
the addressing circuit set includes a set of sense amplifiers defined on the first and second IC dies, and
the I/O circuit set comprises stateful storage circuits defined on the third IC die, the stateful storage circuits comprising one of latches and flip flops.

6. A three-dimensional (3D) circuit comprising:
a first integrated circuit (IC) die comprising a first plurality of memory blocks with a first set of data lines;
a second IC die stacked on top of the first IC die and comprising a second plurality of memory blocks with a second set of data lines;
a third IC die stacked on top of the first and second IC dies and comprising a third set of data lines;
a plurality of z-axis connections that connect the third set of data lines with the first and second sets of data lines to carry data to and from the first and second plurality of memory blocks when data is being written to, and read from, the first and second plurality of memory blocks, wherein a first z-axis connection of the plurality of z-axis connections extends through the second IC die in a z direction perpendicular to the second IC die and is coupled to a data line of the first set of data lines and a data line of the third set of data lines; and
a set of one or more memory circuits, comprising:
the first and second plurality of memory blocks;
a set of addressing circuits to activate different addressed locations in the first and second plurality of memory blocks; and
a set of input/output (I/O) circuits to write/read data to addressed locations in the first and second plurality of memory blocks, the I/O circuit set comprising the third set of data lines, wherein
the addressing circuit set includes a set of sense amplifiers defined on the first and second IC dies, and
the third IC die comprises a plurality of compute circuits that receive through the third set of data lines the data that is read from the memory circuit set.

7. The 3D circuit of claim 6, wherein the compute circuits are processing cores for performing calculations associated with neurons of a neural network.

8. A three-dimensional (3D) circuit comprising:
a first integrated circuit (IC) die comprising a first plurality of memory blocks with a first set of data lines;
a second IC die stacked on top of the first IC die and comprising a second plurality of memory blocks with a second set of data lines;
a third IC die stacked on top of the first and second IC dies and comprising a third set of data lines; and
a plurality of z-axis connections that connect the third set of data lines with the first and second sets of data lines to carry data to and from the first and second plurality of memory blocks when data is being written to, and read from, the first and second plurality of memory blocks, wherein
a first z-axis connection of the plurality of z-axis connections extends through the second IC die in a z direction perpendicular to the second IC die and is coupled to a data line of the first set of data lines and a data line of the third set of data lines, and
the plurality of z-axis connections electrically connect circuit nodes in overlapping portions of the first and third IC dies, and overlapping portions of second and third IC dies, in order to carry data to and from the third set of data lines on the third IC die from and to the first and second sets of data lines of the first and second plurality of memory blocks on the first and second IC dies.

9. The 3D circuit of claim 8 further comprising:
a first plurality of bit lines on the first IC die connected to (i) storage cells of the first plurality of memory blocks, and (ii) the first set of data lines; and
a second plurality of bit lines on the second IC die connected to (i) storage cells of the second plurality of memory blocks, and (ii) the second set of data lines.

10. The 3D circuit of claim 8, wherein each of a subset of z-axis connections is shorter than 10 microns.

11. The 3D circuit of claim 8, wherein each of a subset of z-axis connections is shorter than 5 microns.

12. The 3D circuit of claim 1, wherein the first and second plurality of memory blocks are DRAM memory blocks.

13. The 3D circuit of claim 7, wherein each of a plurality of DRAM memory blocks comprises single cell, single transistor storage cells.

14. The 3D circuit of claim 1, further comprising:
a substrate on which the 3D circuit is mounted.

* * * * *